(12) United States Patent
Barnabo et al.

(10) Patent No.: US 8,261,629 B2
(45) Date of Patent: Sep. 11, 2012

(54) INTERCHANGABLE LEVER ASSEMBLIES

(75) Inventors: Susan M. Barnabo, Walpole, MA (US); Ronald I. Frank, Sharon, MA (US)

(73) Assignee: Stoneridge Control Devices, Inc., Canton, MA (US)

(*) Notice: Subject to any disclaimer, the term of this patent is extended or adjusted under 35 U.S.C. 154(b) by 847 days.

(21) Appl. No.: 12/206,661

(22) Filed: Sep. 8, 2008

(65) Prior Publication Data

US 2009/0095119 A1     Apr. 16, 2009

Related U.S. Application Data

(60) Provisional application No. 60/970,342, filed on Sep. 6, 2007.

(51) Int. Cl.
*G05G 9/047* (2006.01)
(52) U.S. Cl. .................................. 74/471 XY
(58) Field of Classification Search .................. None
See application file for complete search history.

(56) References Cited

U.S. PATENT DOCUMENTS

| | | | |
|---|---|---|---|
| 4,156,817 A | 5/1979 | Preece et al. | |
| 4,519,266 A | 5/1985 | Reinecke et al. | |
| 5,307,013 A | 4/1994 | Santos et al. | |
| 6,892,481 B2 | 5/2005 | Yamamoto et al. | |
| 6,992,478 B2* | 1/2006 | Etherington et al. | 324/207.2 |
| 7,487,850 B2* | 2/2009 | Lucas et al. | 180/65.1 |
| 7,761,254 B2* | 7/2010 | Fouts et al. | 702/115 |
| 2004/0070390 A1* | 4/2004 | Lamb et al. | 324/207.21 |
| 2004/0164731 A1* | 8/2004 | Moreno | 324/207.22 |

OTHER PUBLICATIONS

International Search Report dated Nov. 18, 2008 issued in related International Patent Application No. PCT/US2008/075639.
Examination Report dated Feb. 3, 2012 issued in related U.K Patent Application No. GB1004038.4 (2 pages).

* cited by examiner

*Primary Examiner* — Raymond W Addie
(74) *Attorney, Agent, or Firm* — Grossman, Tucker, Perreault & Pfleger, PLLC

(57) ABSTRACT

A lever assembly. The assembly may include a lever, a shaft coupled to the lever for supporting pivotal movement of the lever, a magnet coupled to the lever, the magnet being configured to rotate upon pivotal movement of the lever, and magnetic field sensor positioned adjacent the magnet for providing an output representative to position of the lever.

21 Claims, 18 Drawing Sheets

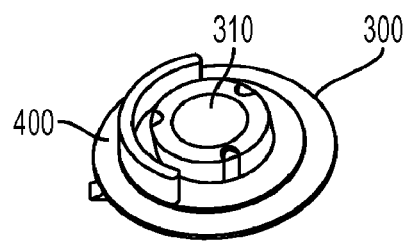 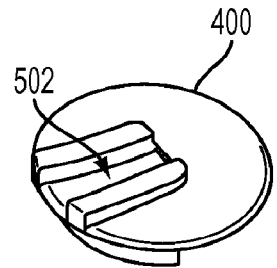
FIG. 5A          FIG. 5B
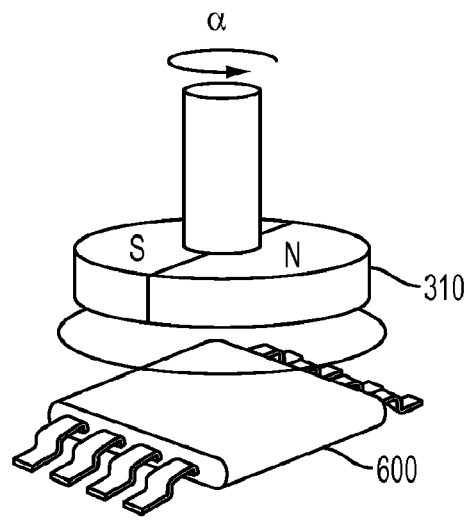
FIG. 6

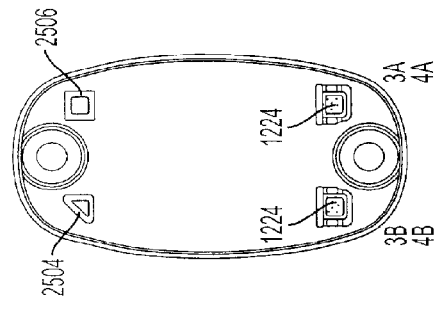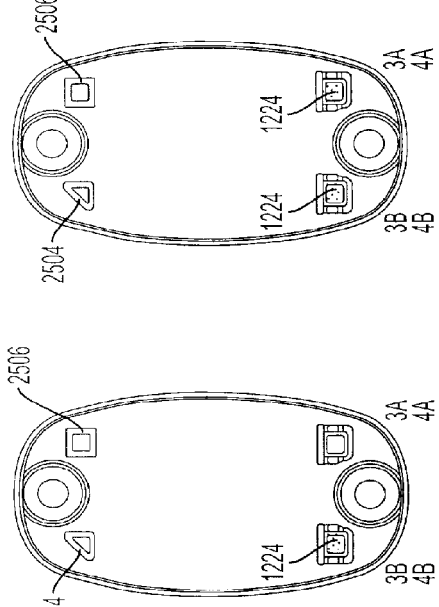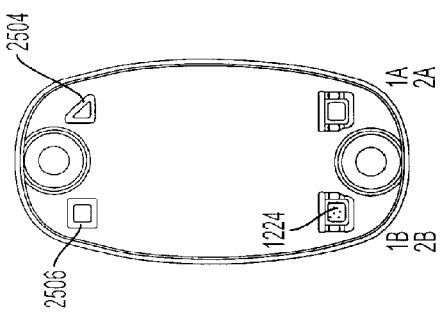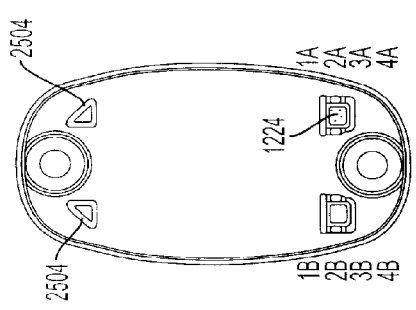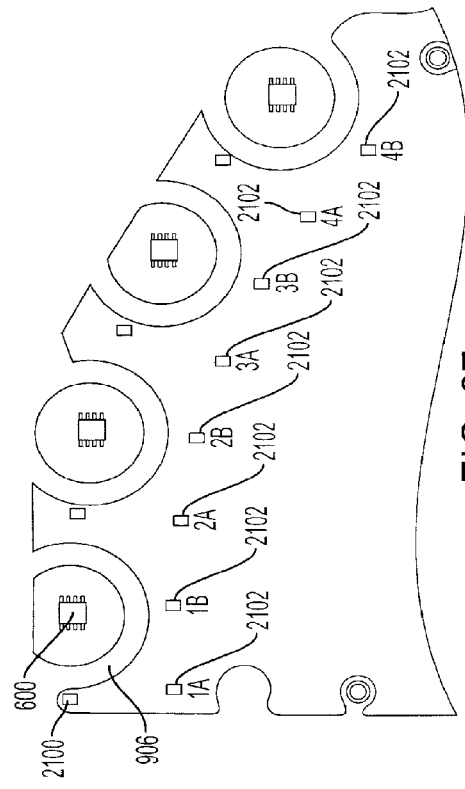

INTERCHANGABLE LEVER ASSEMBLIES

CROSS-REFERENCE TO RELATED APPLICATIONS

This application claims the benefit of the filing date of U.S. Provisional Application Ser. No. 60/970,342 filed Sep. 6, 2007, the teachings of which are hereby incorporated herein by reference.

TECHNICAL FIELD

This disclosure relates to lever assemblies configured for controlling system functionality, and in particular to lever assemblies that may be interchangeable.

BACKGROUND

Lever assemblies may be used for controlling functions in a variety of systems. For example, several lever assemblies may be used to control different associated functions on a forklift or other vehicle.

BRIEF DESCRIPTION OF THE DRAWINGS

Features and advantages of embodiments of the disclosed subject matter will become apparent as the following Detailed Description proceeds, and upon reference to the Drawings, where like numerals depict like parts, and in which:

FIGS. 5A-5B illustrate the magnet carrier/rotor portion of the embodiment illustrated in FIG. 3;

FIG. 6 illustrates interaction of a lever assembly and a magnet carrier consistent with the present disclosure;

FIGS. 26A-26D diagrammatically illustrates keying features and identification magnets for various lever assemblies consistent with the present disclosure;

FIG. 27 diagrammatically illustrates orientation of magnets and hall devices in an exemplary system consistent with the present disclosure in a plan view;

Although the following Detailed Description will proceed with reference being made to illustrative embodiments, many alternatives, modifications, and variations thereof will be apparent to those skilled in the art. Accordingly, it is intended that the claimed subject matter be viewed broadly.

DETAILED DESCRIPTION

The description provided herein is with reference to various exemplary embodiments. It is to be understood that the embodiments described herein are presented by way of illustration, not of limitation. Also, the embodiments may be described herein with respect to a forklift application. The present invention may be incorporated into a wide variety of systems without departing from the spirit and scope of the invention. In general, a system and method consistent with the present disclosure may involve providing lever assemblies with "plug and play" capability within a desired application. Features of the lever assemblies and mating portions, combined with identification magnets, allow facile removal and replacement of the lever assemblies. When the lever assemblies are installed in associated mating portions, they may be automatically recognized and identified by an associated module positioned in the mating portion and below the lever assembly. Assembly errors, e.g. assembly of an incorrect lever assembly into a mating portion may also be automatically detected. This recognition, identification and/or error identification may be accomplished without use of a direct electrical connection.

Figure 1:
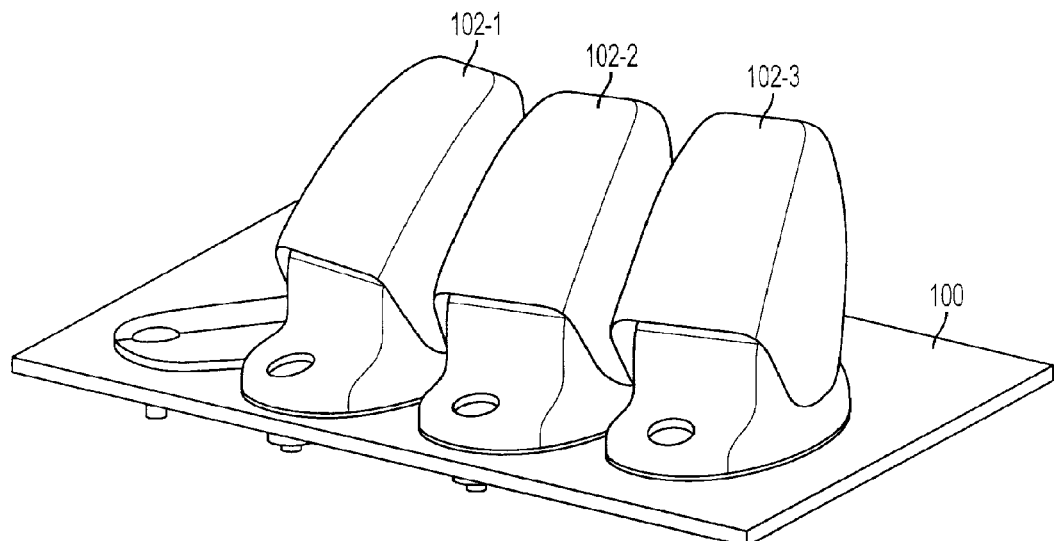
FIG. 1 is a perspective view of an assembly consistent with the present disclosure.
Figure 2:
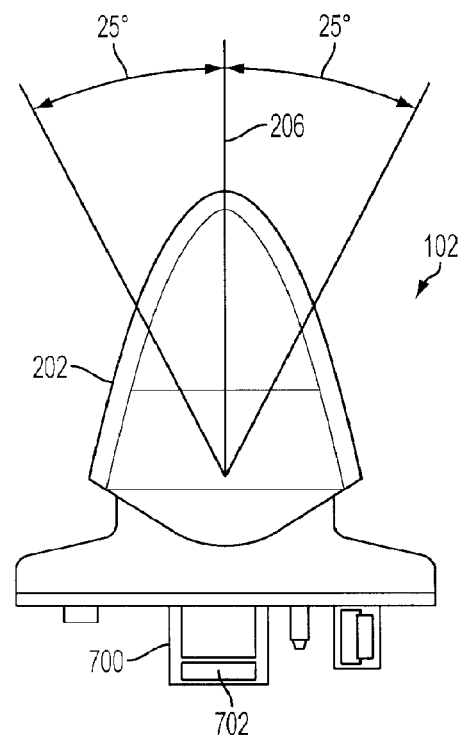
FIG. 2 is a side view of a lever assembly consistent with the present disclosure.

Turning to FIG. 1, there is shown an exemplary arm rest assembly 100 including a plurality of lever assemblies 102-1, 102-2, 102-3 coupled to an associated system, e.g. a construction vehicle armrest 100, consistent with the present disclosure. As shown the lever assemblies may be mounted on top surface of the assembly 100. As will be described in greater detail below, an associated printed circuit board (PCB) module assembly may be located within the armrest. The lever assemblies may cooperate with sensors, e.g. magnetic field sensors such as Hall Effect devices, and electronics on the PCB assembly to control functionality of a system, such as a forklift or other construction vehicle, and to provide recognition, identification and/or error identification related to the lever assemblies. As illustrated in FIG. 2, in one embodiment each lever assembly 102 may include a lever 202 pivotable through a range of about +/−25° from a centerline 206 of the lever 202 in an at-rest position.

Figure 4:
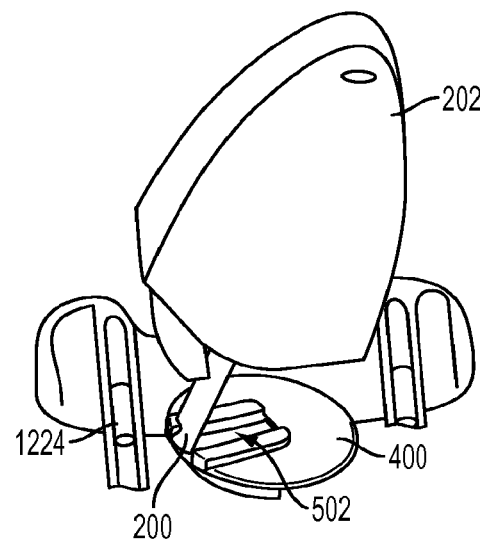
FIG. 4 is a perspective, partial phantom view of the embodiment illustrated in FIG. 3.

FIG. 2 illustrates an exemplary lever assembly 102 in bottom perspective view. As shown, the lever 202 may be pivot about pivot shaft 302 for causing corresponding movement of a pivot arm, e.g. against the bias of a torsion spring 304. Movement of the lever 202, e.g. by an operator, may cause corresponding movement of the pivot arm 200. When the assembly 102 is mounted in an associated mating portion 306, e.g. in a top surface of an assembly 100, the pivot arm 200 may extend through an opening 308 in the mating portion for rotating or otherwise moving one or more magnets 310 associated with the PCB assembly 312. As shown in FIG. 4, for example, the pivot arm may 200 extend through the opening 206 to engage a magnet carrier 400 for causing rotational movement of the magnet carrier 400 and a magnet carried thereby upon movement of the lever 202. FIG. 5A is a bottom view of the magnet carrier 400 showing the magnet 310 carried thereby, and FIG. 5B is a top view of the magnet carrier 400. As shown, the magnet carrier may include a channel 502 for receiving the pivot arm. The channel may be configured to engage the pivot arm during motion thereof to cause rotation of the magnet carrier and the magnet carried thereby.

FIG. 6 diagrammatically illustrates rotation of a magnet 300 adjacent an associated Hall effect device 600, e.g. a known tri-axis Hall Effect device. Rotation of the magnet 310 may be sensed by the Hall Effect device and an output representing lever position may be provided from the Hall Effect device 600 to a control system for controlling system functionality.

Figure 3:
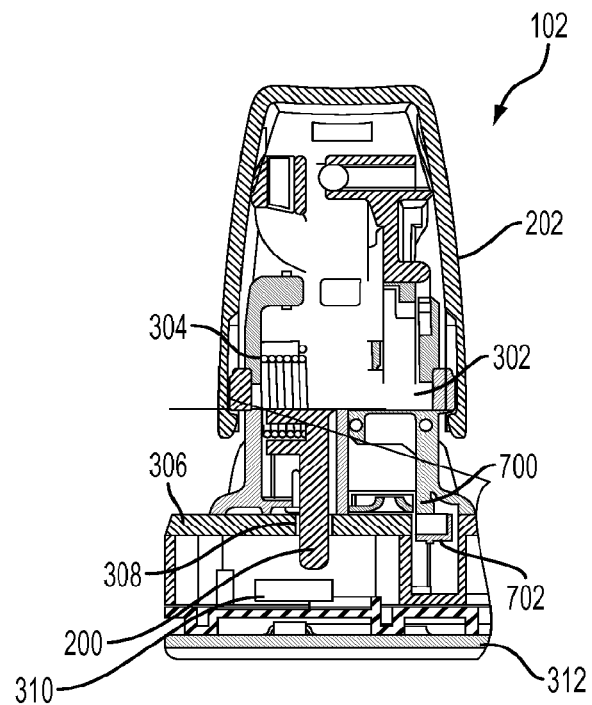
FIG. 3 is a sectional view of one embodiment of a lever assembly consistent with the present disclosure coupled to an associated printed circuit board (PCB) assembly.
Figure 7:
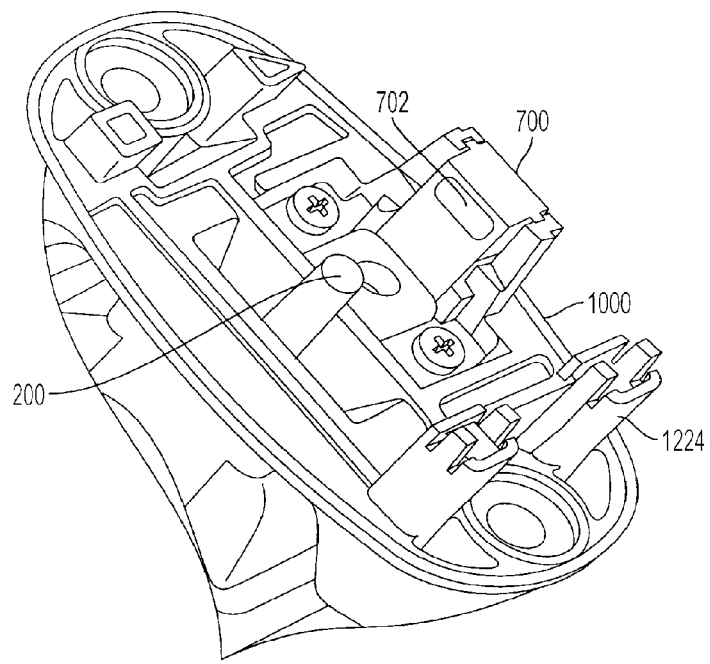
FIG. 7 illustrates a lever assembly including a push feature consistent with the present disclosure.

As shown in FIG. 7 and also in the sectional view of FIG. 3, lever assembly 102 may also or alternatively include a push rod 700 including a push magnet 702 coupled thereto. The push rod may be coupled to the lever 202 for linear movement corresponding to linear movement of the lever, i.e. up/down movement of the lever. Depressing of the lever 202 may cause the push rod to extend outward from the lever assembly 102 to place the push magnet 702 in proximity to a Hall Effect device. When the lever is depressed, the Hall Effect Device may sense the magnet 702 to actuate an associated feature of the system. When the lever is released, the push rod 700 may retract into the assembly (e.g. to the position shown in FIG. 3) and the Hall Effect device may indicate that the push magnet is no longer present.

Figure 8:
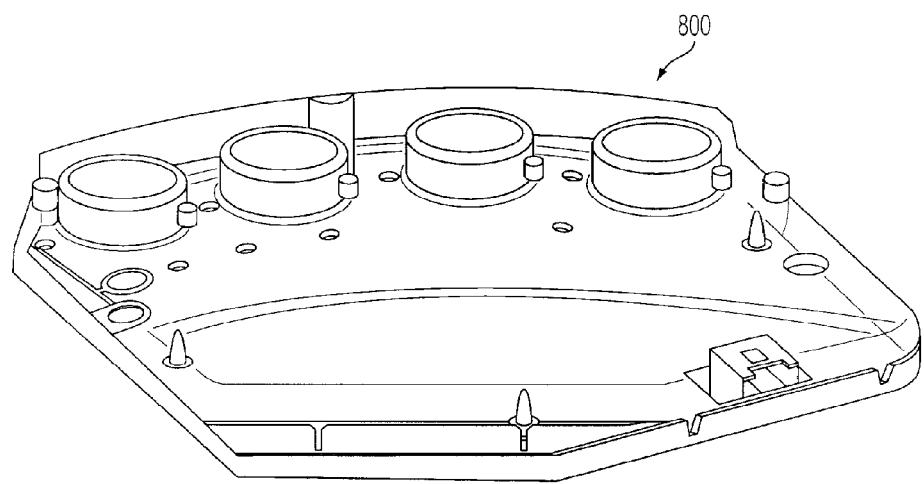
FIG. 8 is a perspective view of an exemplary PCB assembly consistent with the present disclosure.
Figure 9:
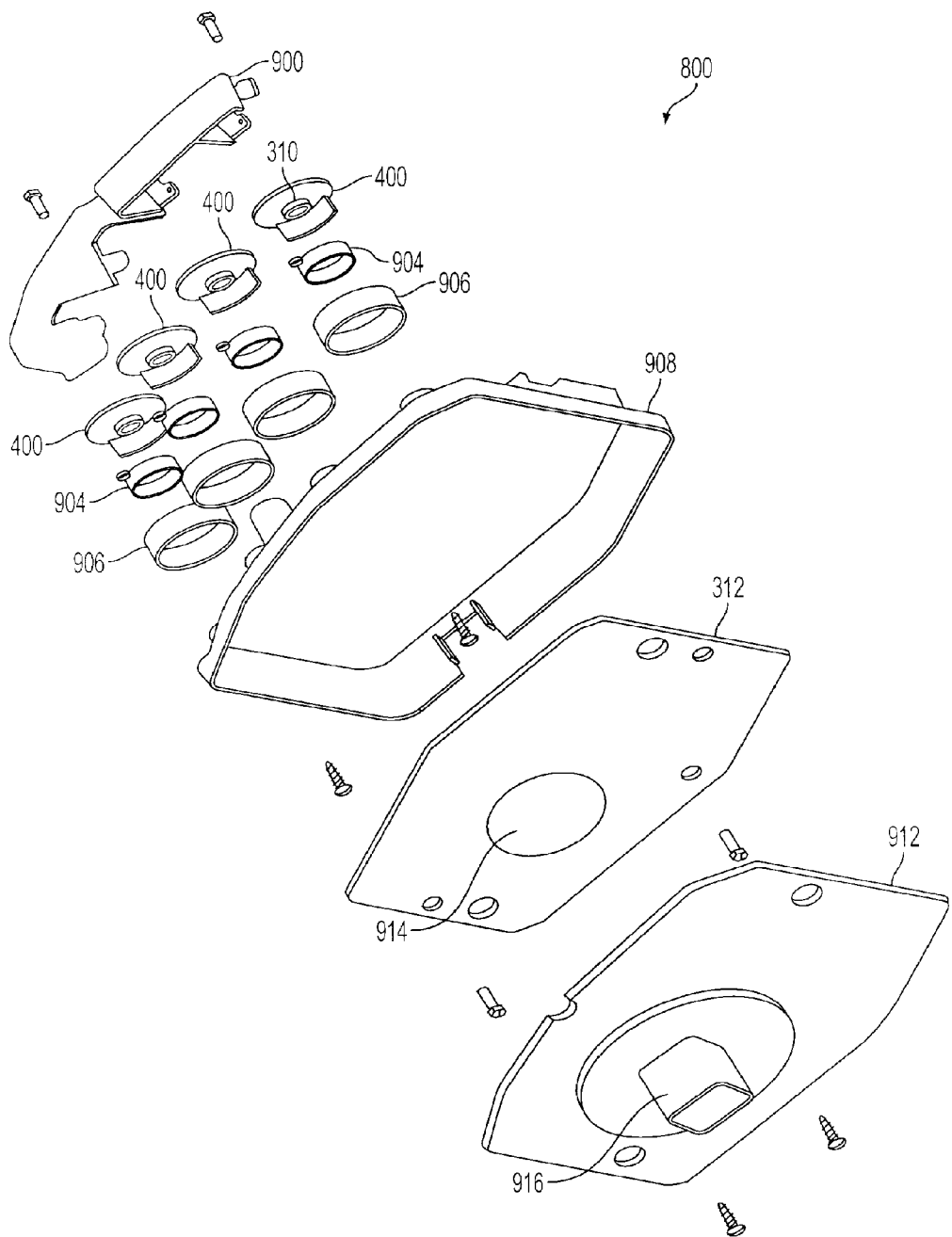
FIG. 9 is an exploded view of the assembly illustrated in FIG. 8.

An exemplary PCB module assembly 800 consistent with the present disclosure is illustrated in FIGS. 8 and 9. As shown in the exploded views of FIG. 9, the assembly 800 may include a magnet rotor cover 900, magnet carriers/rotors 400, torsion springs 904, magnetic shields 906, a module housing 908, a PCB 312 and a back cover 912. A direct connection to the electronics on the PCB 312, e.g. via conductive pins coupled to the electronics and extending into an integral connector interface 916, may be incorporated into the back cover 912 for providing input/output to the electronics on the PCB 312.

Figure 10:
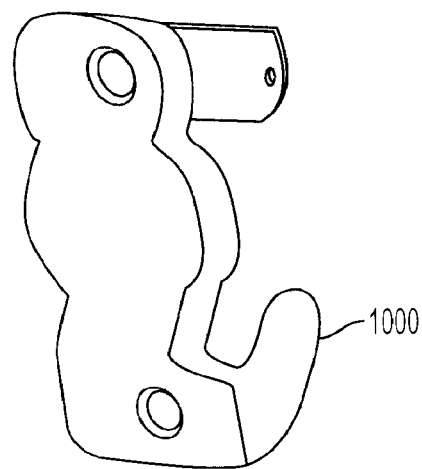
FIGS. 10 is a perspective view of an exemplary embodiment of a push magnet steel shunt consistent with the present disclosure.
Figure 11:
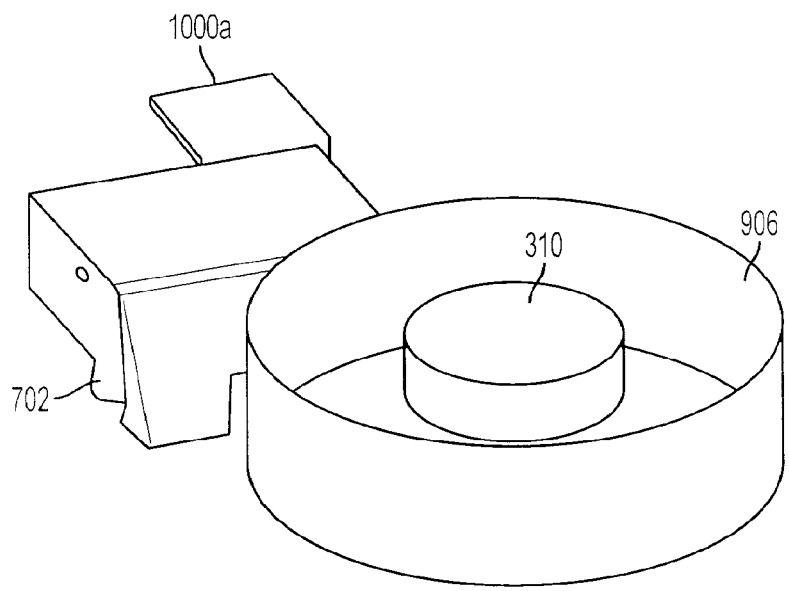
FIG. 11 is a perspective view of another exemplary embodiment of a push magnet steel shunt consistent with the present disclosure including an annular magnetic shunt associated with a rotary magnet.

As shown the shields 1406 may be annular metallic shields for shielding field associated with magnets 310 in the magnet carriers/rotors 300, thereby preventing such fields from effecting output of other sensors in the system and preventing other magnets in the system from affecting the output of the Hall device 600 used for sensing lever 202 positions. Likewise, as shown in FIGS. 7 and 10, a steel shunt 1000 may be used to shunt out fields associated with a push magnet 702 when the push rod 700 is an extended position. FIG. 11 illustrates an alternative shielding arrangement including a shield 1000a and a ring shield 906 for shunting fields from associated magnets 310 and 702, respectively.

Figure 12:
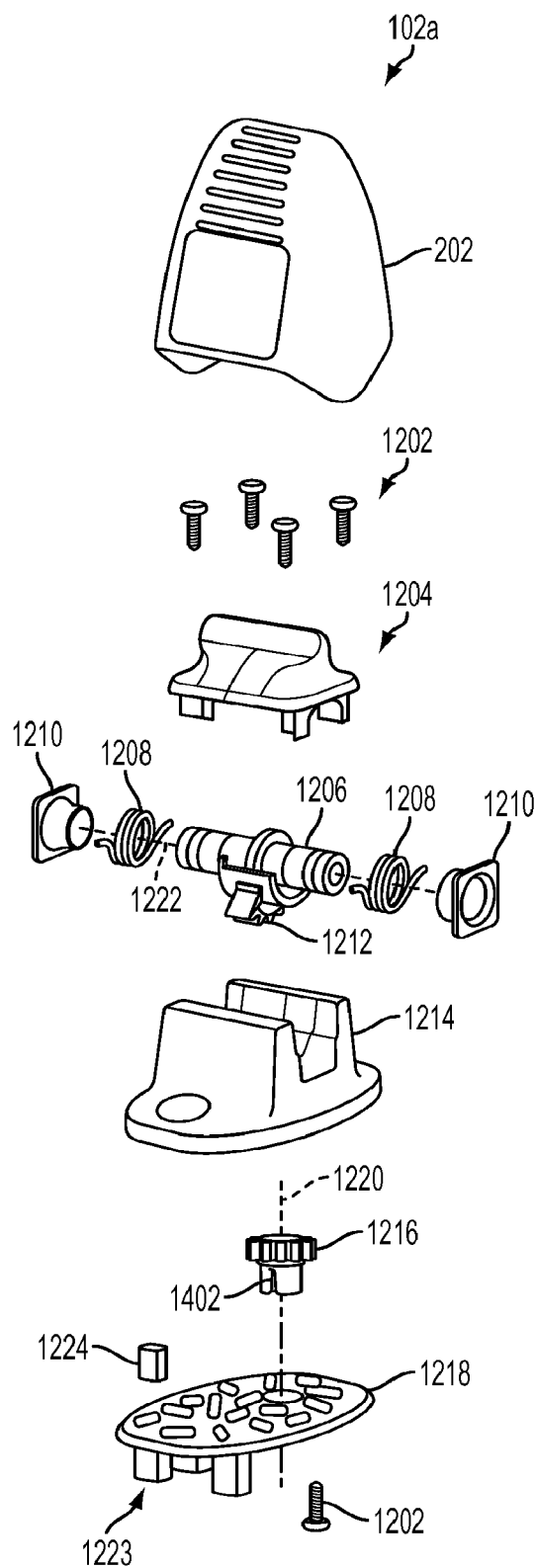
FIG. 12 is an exploded view of another exemplary embodiment of a lever assembly consistent with the present disclosure.
Figure 13:
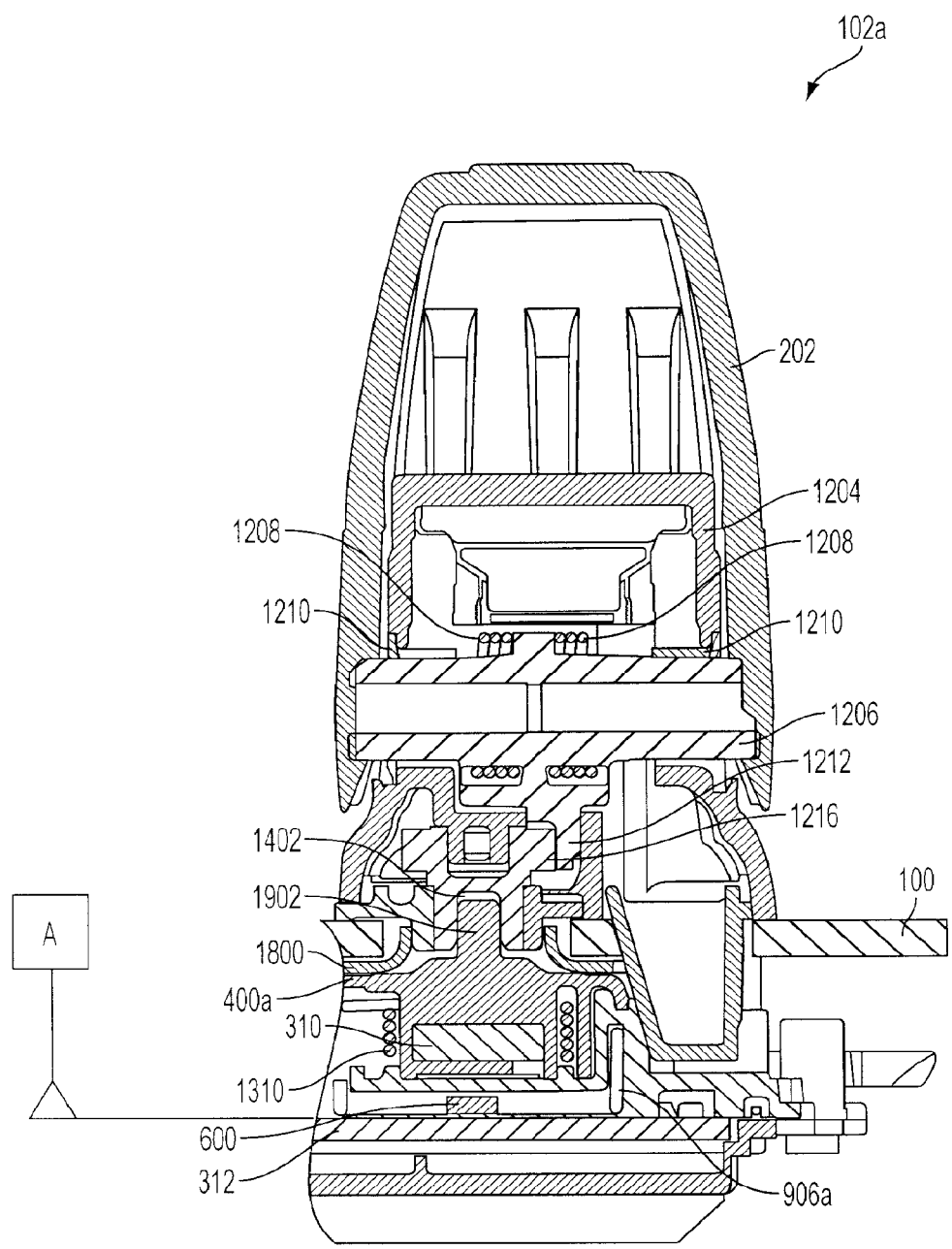
FIG. 13 is a sectional view of the embodiment illustrated in FIG. 12.
Figure 15:
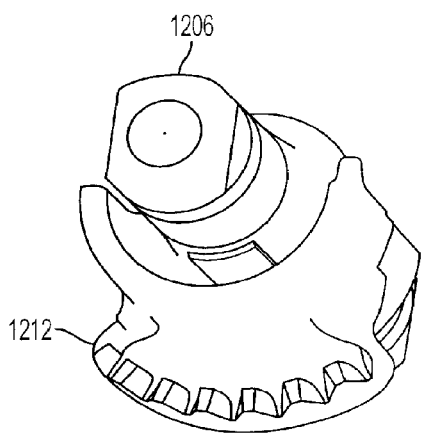
FIG. 15 is a perspective view of the face gear portion and shaft of the embodiment illustrated in FIG. 12.
Figure 16:
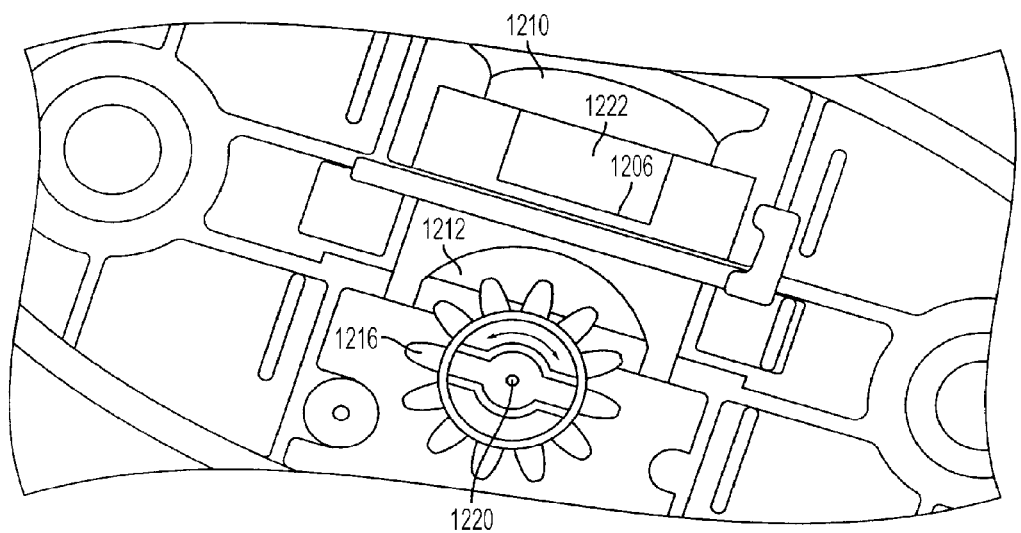
FIG. 16 is a bottom partial cut-away view of the embodiment illustrated in FIG. 12 illustrating engagement of the pinion and face gears.

FIGS. 12 and 13 illustrate another embodiment of a lever assembly 102a, including a lever 202, fasteners, e.g. plastic thread forming screws 1202, a lever cover 1204, a pivot shaft 1206, lever torsion springs 1028, lever bushings 1210, a face gear 1212, a lever base 1214, a lever pinion 1216, a bottom cover 1218, and at least one identification magnet 1224 received in an associated pocket 1223. The pivot shaft 1206 may be pivotally supported between the cover 1204 and base 1214 by the bushings for allowing rotation of the shaft relative to the base and cover. The lever 202 may be coupled to the pivot shaft 1206 for causing rotation of the pivot shaft 1206 and the face gear 1212 coupled thereto upon rotation of the lever in fore and aft directions, e.g. against the bias of the torsion springs 1208. The pinion 1216 and face gear 1212 are more particularly shown in FIGS. 14 and 15, respectively. As shown in FIG. 16, the face gear 11212 may meshingly engage the pinion 1216 to cause rotation of the pinion gear 1216 about an axis 1220 that is substantially perpendicular to an axis of rotation 1222 of the pivot shaft 1206. In one embodiment, for example, a +/−25° motion of the lever is converted to rotation that is 90° (perpendicular) from the lever rotation using a gear ratio of 2.33 to 1 to magnify the lever resolution.

Figure 17A:
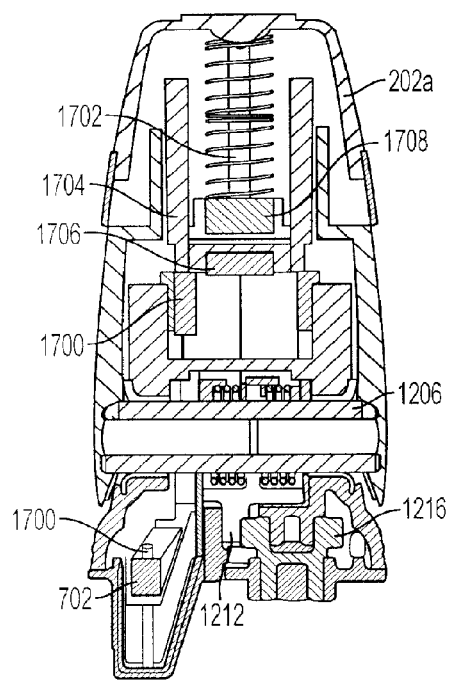
FIGS. 17A and 17B are sectional views of an embodiment of a lever assembly consistent with the present disclosure including a push feature consistent with the present disclosure.
Figure 17B:
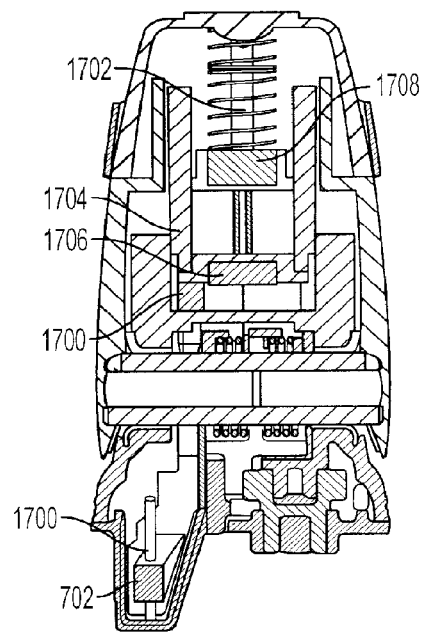

As shown in FIGS. 17A and 17B, lever assembly 102a may also or alternatively include a push rod 1700 including a push magnet 702 coupled thereto. The push rod may be coupled to the lever 202 for linear movement corresponding to linear movement of the lever, i.e. up/down movement of the lever. In the illustrated exemplary embodiment, the lever is biased to an outward position shown in FIG. 17A by a compression spring 1702 and includes an extension extending from an inner surface thereof. A bottom of the extension carries a magnet 1706. A second magnet is disposed between arms of the extension and between the inner surface of the lever 202 and the magnet 1706. The magnets 1706 and 1708 may be positioned in opposed facing relationship, as shown, to provide a magnetic detent resulting from magnetic attraction. Depressing of the lever 202 to overcome the attraction between the magnets 1706 and 1708 and against the bias of the compression spring may cause the push rod 1700 to extend outward from the lever assembly 102a to place the push magnet 702 in proximity to a Hall Effect device. When the lever is depressed, as shown in FIG. 17B, the Hall Effect Device may sense the magnet 702 to actuate an associated feature of the system. When the lever is released, the push rod 1700 may retract into the assembly, e.g. due to the bias of the spring 1702, and may be detented by the attraction between the magnets 1706 and 1708. When the push rod is retracted into the assembly, as shown in FIG. 17A, the Hall Effect device may indicate that the push magnet is no longer present.

Figure 18:
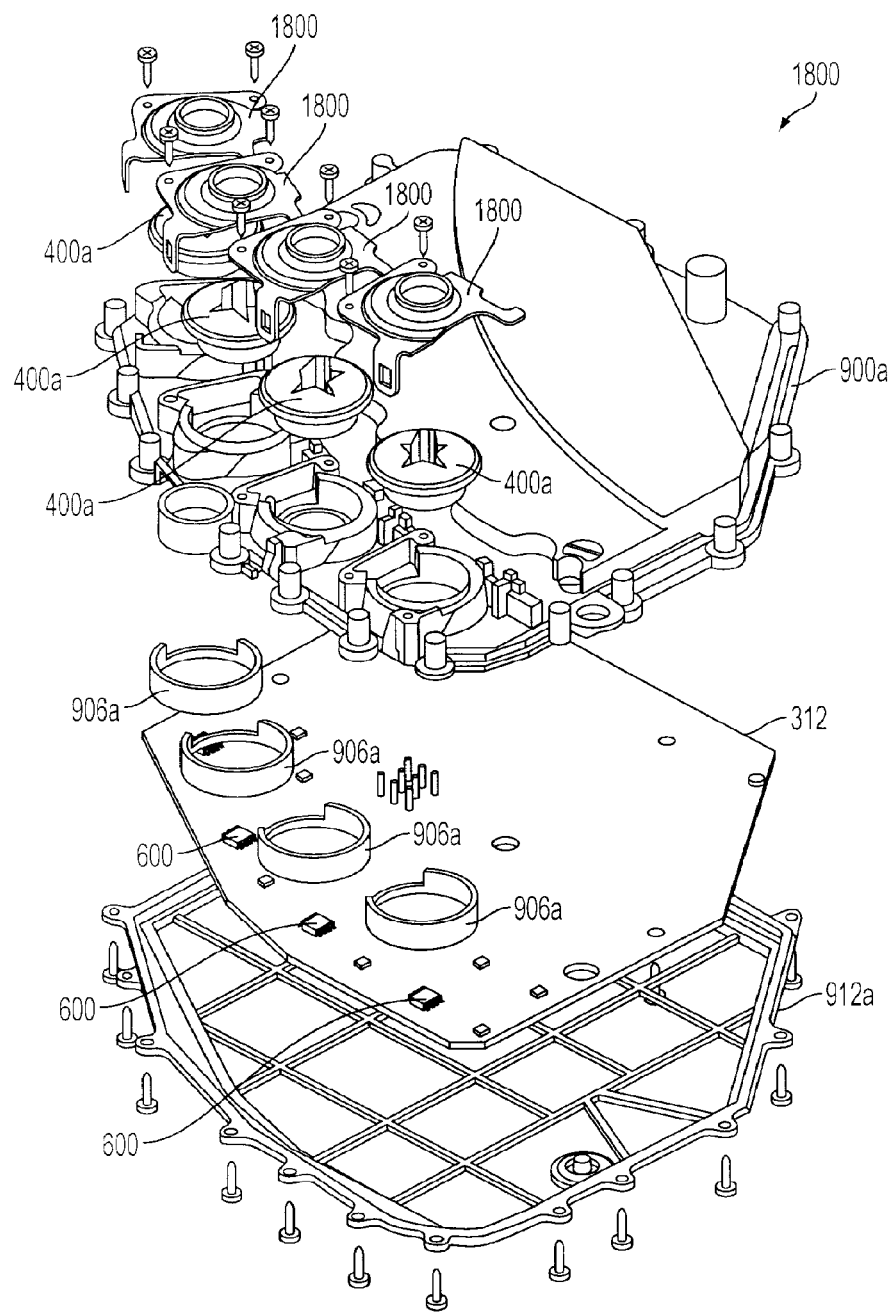
FIG. 18 is an exploded view of another embodiment of a PCB assembly consistent with the present disclosure.

An exemplary PCB module assembly 1800 useful in connection with the lever assembly 102a consistent with the present disclosure is illustrated in FIG. 18. As shown the assembly 1800 may include a magnet rotor cover 900a, magnet carriers/rotors 400a, rotor covers 1800, magnetic shields 906a, a PCB 312 and a back cover 912a. A direct connection to the electronics on the PCB 312, e.g. via conductive pins coupled to the electronics and extending into an integral connector interface, may be incorporated into the back cover 912a for providing input/output to the electronics on the PCB 312.

Figure 14:
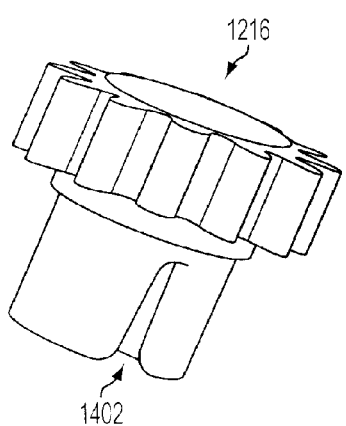
FIG. 14 is a perspective view of the pinion portion of the embodiment illustrated in FIG. 12.
Figure 19A:
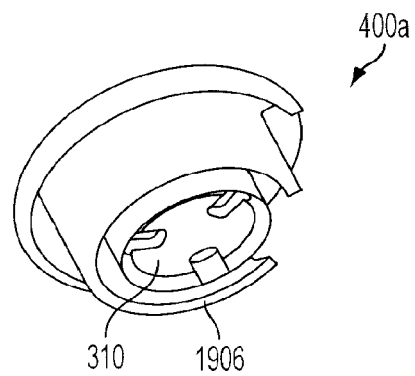
FIGS. 19A-19B illustrate the magnet carrier/rotor portion of the embodiment illustrated in FIG. 18.
Figure 19B:
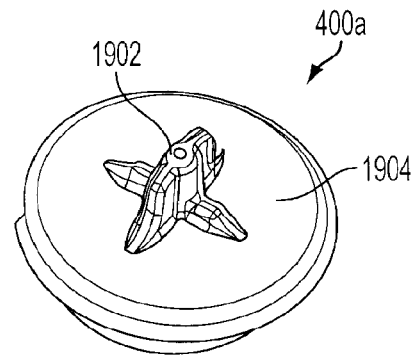

As shown in FIGS. 19A and 19B the magnet rotors 400a may include a tab 1902 extending from a top surface thereof 1904, and a magnet 310 coupled thereto, e.g. adjacent a bottom surface 1906 thereof. As shown in FIGS. 13 and 14, the pinion gear 1216 may include a slot in the bottom thereof. The slot may be sized and dimensioned to closely receive the tab portion of a magnet rotor, whereby rotation of the pinion corresponding to pivotal movement of the lever 202 causes corresponding rotation of the magnet rotor 400a and the magnet 310 coupled thereto, e.g. against the bias of a torsion spring 1310 (FIG. 13). A Hall Effect device disposed below the magnet 310 may provide an output indicative of the position of the lever arm 202.

Figure 20:
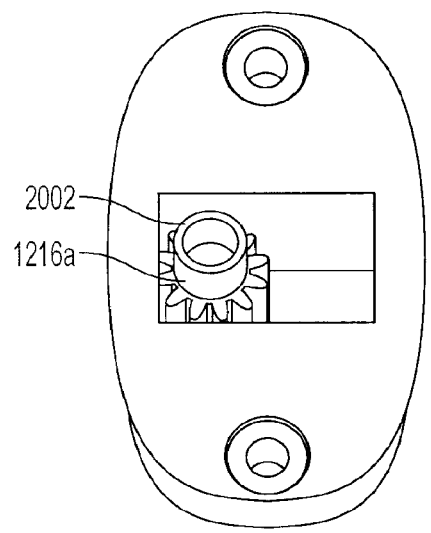
FIG. 20 is a perspective view of another embodiment of a lever assembly consistent with the present disclosure.

Other mechanisms for moving a magnet carrier/rotor with associated movement of a lever may be implemented consistent with the present disclosure. As shown in FIG. 20, for example, the pinion gear may be coupled to the magnet carrier by a shaped peg extending from the top of the magnet rotor that may be received in a corresponding shaped pocket 2002 in a pinion gear 1216a.

Figure 21:
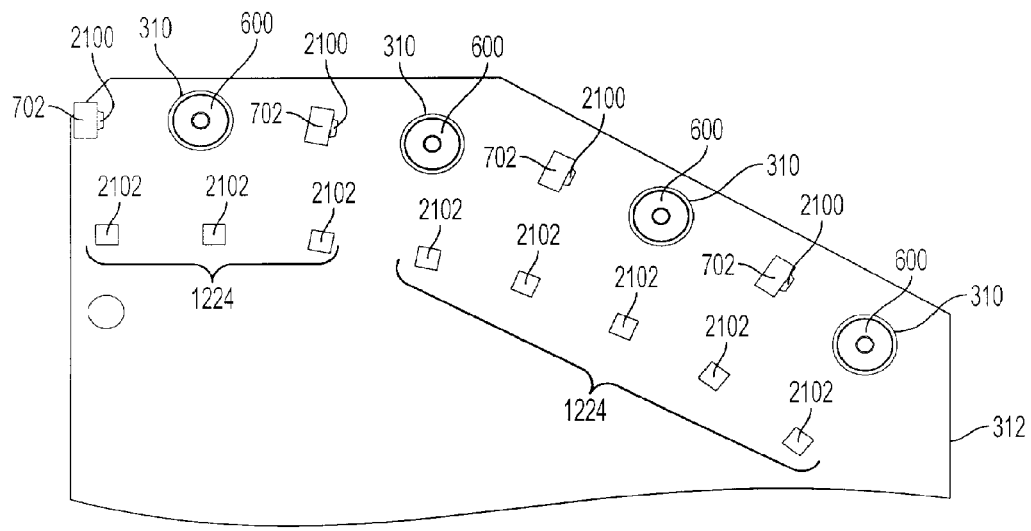
FIG. 21 diagrammatically illustrates orientation of magnets and hall devices in an exemplary system consistent with the present disclosure in a plan view.
Figure 22:
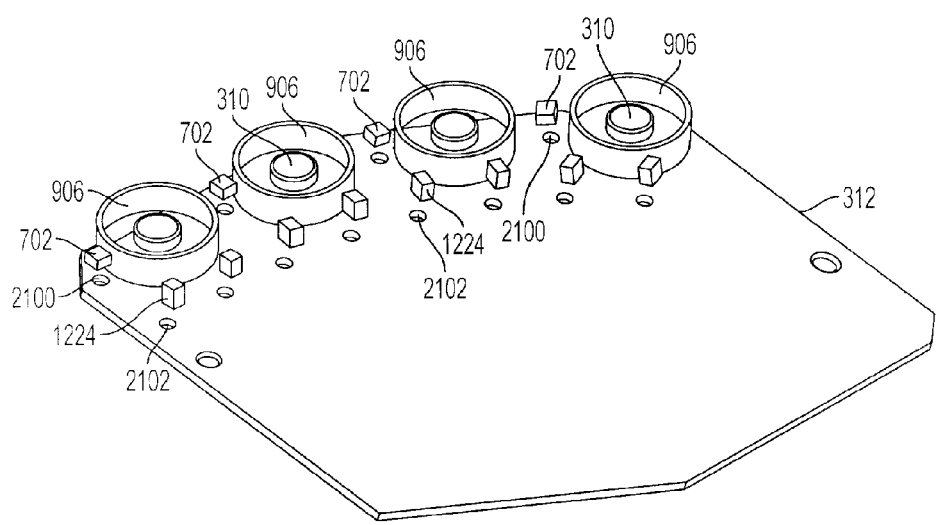
FIG. 22 diagrammatically illustrates orientation of magnets and hall devices in an exemplary system consistent with the present disclosure in a perspective view.
Figure 23:
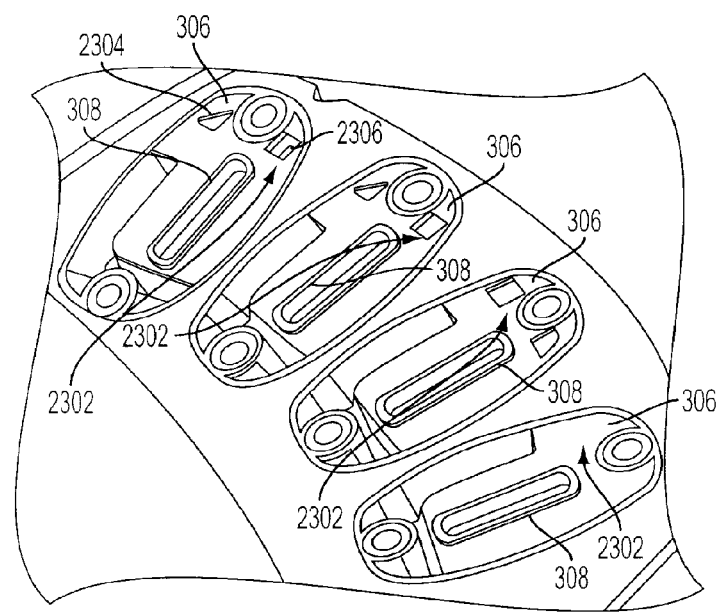
FIG. 23 is a perspective view of one embodiment of a plurality of separate mating portions for associated lever assemblies in an exemplary system consistent with the present disclosure.
Figure 24:
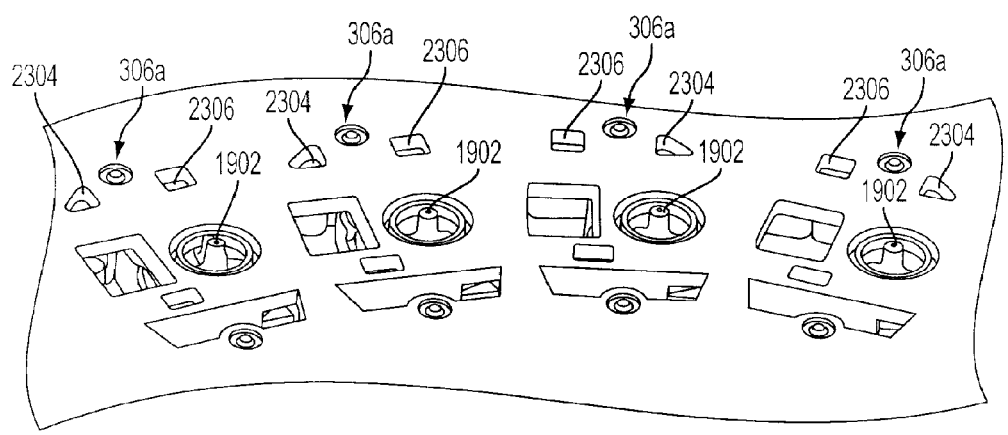
FIG. 24 is a perspective view of another embodiment of a plurality of separate mating portions for associated lever assemblies in an exemplary system consistent with the present disclosure.

FIGS. 21 and 22 illustrate relative orientation of rotary magnets 310 and their associated Hall devices 600 and shields 906,906a, push magnets 702 and their associated Hall devices 2100, and identification (ID) magnets 1224 and their associated Hall Effect devices 2102. The illustrated exemplary embodiment includes 4 rotary magnets 310, 4 push magnets 702 and 8 ID magnets, and may use 12 digital Hall devices and 4 programmable linear Hall devices.

Figure 25:
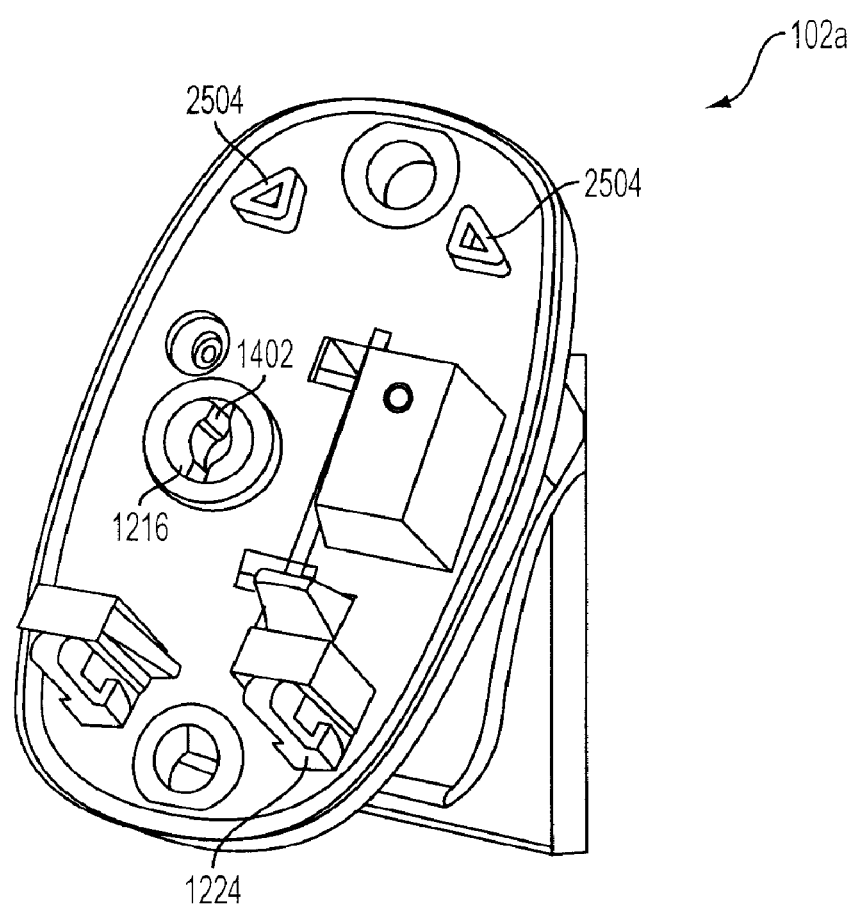
FIG. 25 is a bottom view of the lever assembly illustrate in FIG. 12.
Figure 28:
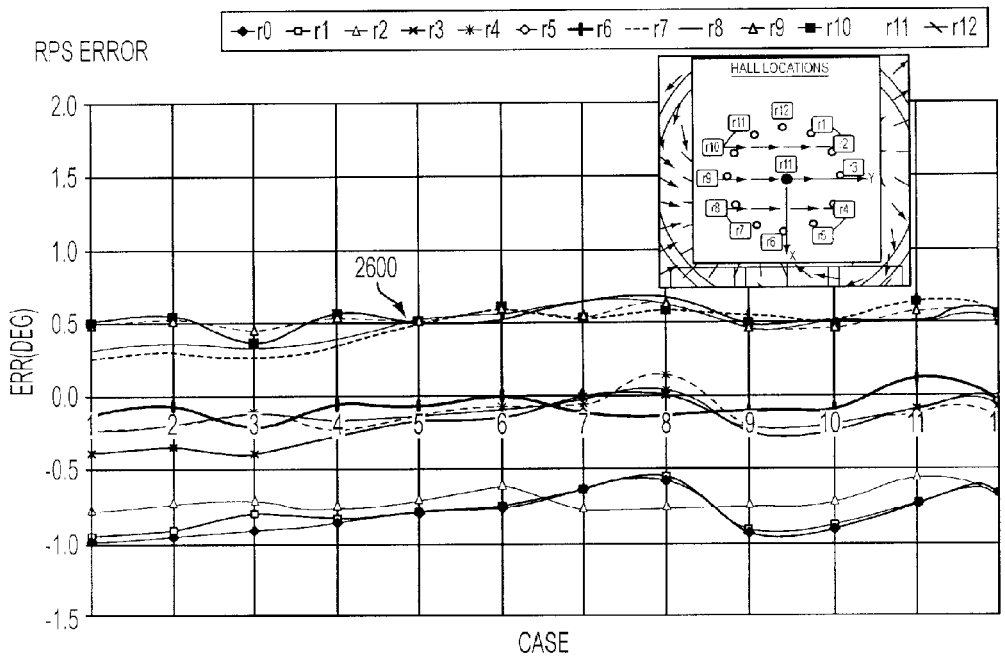
FIG. 28 includes plots of position error vs. hall location associated with a rotary magnet consistent with the present disclosure.
Figure 29:
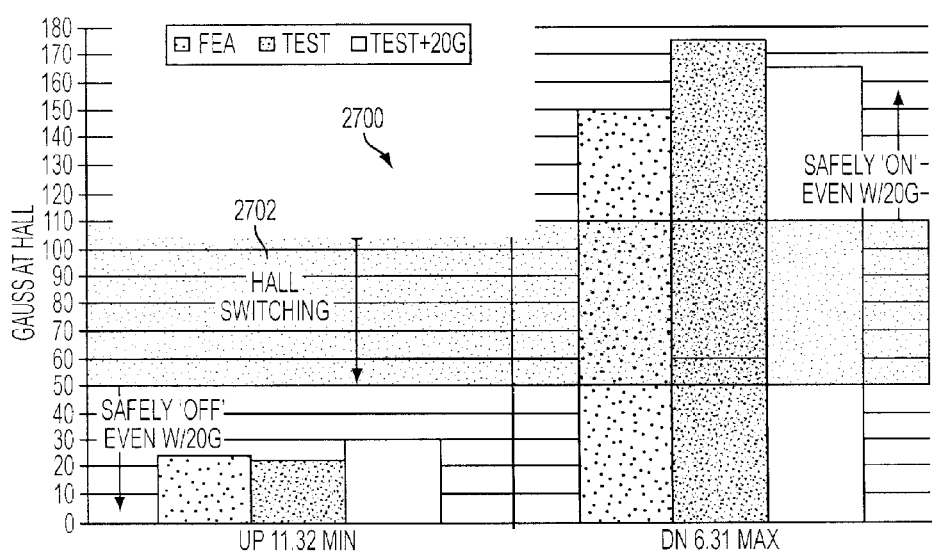
FIG. 29 includes plots of gauss vs. push magnet position associated with a push magnet consistent with the present disclosure.
Figure 30:
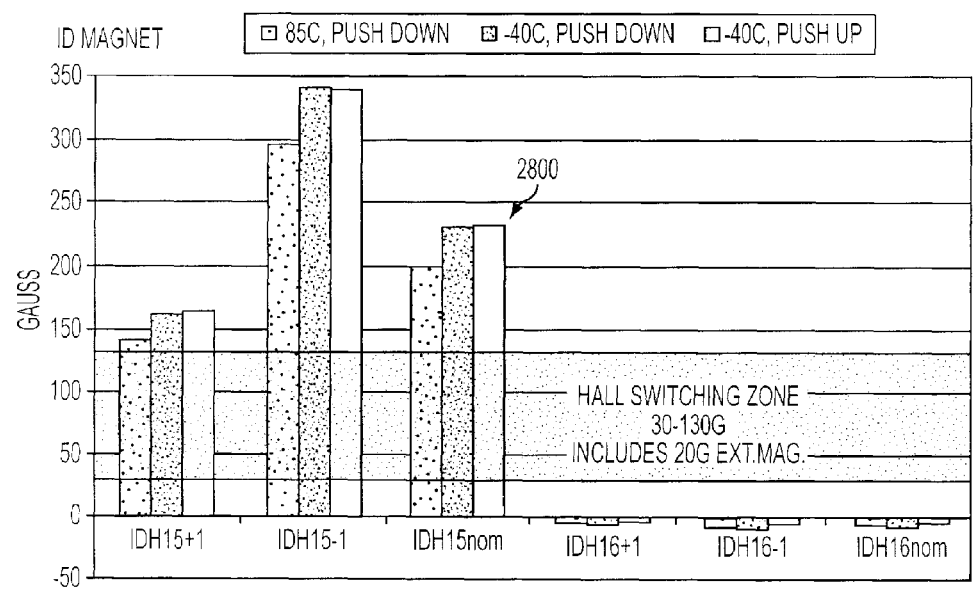
FIG. 30 includes plots of gauss vs. identification magnet position associated with an identification magnet configuration consistent with the present disclosure.

FIG. 26 illustrates exemplary mating portions 306 associated with exemplary lever assemblies 102, and FIG. 27 illustrates exemplary mating portions 306a associated with exemplary lever assemblies 102a. As shown, the mating portions include exemplary keying features 2302. In the illustrated exemplary embodiment, the features 2302 include combinations of different geometric mating receptacles 2304, 2306. In the illustrated exemplary embodiment, generally square receptacles 2306 and generally triangular receptacles 2304 are provided, although the receptacles may be of any geometric shape. The receptacles may be sized and positioned to mate with mating pegs on the bottom surfaces of the associated lever assemblies 102, 102a. FIG. 25, for example, is a bottom view of a lever assembly 102a illustrating mating pegs 2504 to be received within corresponding mating features 2304, 2306.

FIGS. 26A-D illustrate bottom views of various lever assemblies 102, 102a with features not common to the assemblies not shown for ease of explanation. The square receptacles 2306 may be sized and positioned to receive square 2506 or triangular 2504 mating pegs on associated lever assemblies 102, 102a, whereas the triangular receptacles 2304 may receive only triangular mating pegs 2504 (not the square mating pegs 2506). This provides a keying system whereby only lever assemblies 102, 102a having appropriate mating peg configurations may be inserted into an associated mating portion 306, 306a. This feature may be used to prevent mounting of certain lever assemblies 102, 102a into certain mating portions 306, 306a.

As shown in FIGS. 26A-D, the lever assemblies may also include one or more associated ID magnets 1224 mounted thereto in different combinations, e.g. in associated pockets. The ID magnets 1224 may be positioned in opposed relationship to associated ID Hall devices 2102, as shown in FIGS. 21 and 22. The digital Hall devices 2102 may react to the magnets 1224 when the magnets are in close proximity. The respective outputs of the Hall devices 2102 may be provide data on a vehicle bus, e.g. a CAN bus, indicating status and presence, of the lever assemblies, without requiring a direct electrical connection between the lever assembly and the PCB. Table 1 below, for example, is one embodiment of a matrix illustrating the data ("CAN data" in Table 1) resulting from the Hall device 2101 outputs where the Hall devices are numbered ("Hall #" in Table 1) according to the correspondingly numbered locations in FIG. 27, along with the corresponding diagnostic conditions and CAN message and data location:

TABLE 1

| Hall # | Hall State | | Hall # | Hall State | Lever Present | Lever Type | CAN message and data location | CAN data |
|---|---|---|---|---|---|---|---|---|
| 1A | diagnose | and | 1B | diagnose | error | error | ILMProp2, byte 7 bits 1-4 | 0000 |
| 1A | diagnose | and | 1B | 5 to 6.9 mA | error | error | ILMProp2, byte 7 bits 1-4 | 0001 |
| 1A | diagnose | and | 1B | 12 to 17 mA | error | error | ILMProp2, byte 7 bits 1-4 | 0010 |
| 1A | 5 to 6.9 mA | and | 1B | diagnose | error | error | ILMProp2, byte 7 bits 1-4 | 0011 |
| 1A | 12 to 17 mA | and | 1B | diagnose | error | error | ILMProp2, byte 7 bits 1-4 | 0100 |
| 1A | 5 to 6.9 mA | and | 1B | 5 to 6.9 mA | no | no lever present | ILMProp2, byte 7 bits 1-4 | 0101 |
| 1A | 12 to 17 mA | and | 1B | 5 to 6.9 mA | yes | standard (plain) lever | ILMProp2, byte 7 bits 1-4 | 0110 |
| 1A | 5 to 6.9 mA | and | 1B | 12 to 17 mA | yes | RTST or RTSH lever (lever with non-gated push button) | ILMProp2, byte 7 bits 1-4 | 0111 |
| 1A | 12 to 17 mA | and | 1B | 12 to 17 mA | error - for now | not used in position 1 and 2 | ILMProp2, byte 7 bits 1-4 | 1000 |
| 2A | diagnose | and | 2B | diagnose | error | error | ILMProp2, byte 7 bits 5-8 | 0000 |
| 2A | diagnose | and | 2B | 5 to 6.9 mA | error | error | ILMProp2, byte 7 bits 5-8 | 0001 |
| 2A | diagnose | and | 2B | 12 to 17 mA | error | error | ILMProp2, byte 7 bits 5-8 | 0010 |
| 2A | 5 to 6.9 mA | and | 2B | diagnose | error | error | ILMProp2, byte 7 bits 5-8 | 0011 |
| 2A | 12 to 17 mA | and | 2B | diagnose | error | error | ILMProp2, byte 7 bits 5-8 | 0100 |
| 2A | 5 to 6.9 mA | and | 2B | 5 to 6.9 mA | no | no lever present | ILMProp2, byte 7 bits 5-8 | 0101 |

TABLE 1-continued

| Hall # | Hall State | | Hall # | Hall State | Lever Present | Lever Type | CAN message and data location | CAN data |
|---|---|---|---|---|---|---|---|---|
| 2A | 12 to 17 mA | and | 2B | 5 to 6.9 mA | yes | standard (plain) lever | ILMProp2, byte 7 bits 5-8 | 0110 |
| 2A | 5 to 6.9 mA | and | 2B | 12 to 17 mA | yes | RTST or RTSH lever (lever with non-gated push button) | ILMProp2, byte 7 bits 5-8 | 0111 |
| 2A | 12 to 17 mA | and | 2B | 12 to 17 mA | error - for now | not used in position 1 and 2 | ILMProp2, byte 7 bits 5-8 | 1000 |
| 3A | diagnose | and | 3B | diagnose | error | error | ILMProp2, byte 8 bits 1-4 | 0000 |
| 3A | diagnose | and | 3B | 5 to 6.9 mA | error | error | ILMProp2, byte 8 bits 1-4 | 0001 |
| 3A | diagnose | and | 3B | 12 to 17 mA | error | error | ILMProp2, byte 8 bits 1-4 | 0010 |
| 3A | 5 to 6.9 mA | and | 3B | diagnose | error | error | ILMProp2, byte 8 bits 1-4 | 0011 |
| 3A | 12 to 17 mA | and | 3B | diagnose | error | error | ILMProp2, byte 8 bits 1-4 | 0100 |
| 3A | 5 to 6.9 mA | and | 3B | 5 to 6.9 mA | no | no lever present | ILMProp2, byte 8 bits 1-4 | 0101 |
| 3A | 12 to 17 mA | and | 3B | 5 to 6.9 mA | yes | standard (plain) lever | ILMProp2, byte 8 bits 1-4 | 0110 |
| 3A | 5 to 6.9 mA | and | 3B | 12 to 17 mA | yes | Dual function lever (big "H"-gate) | ILMProp2, byte 8 bits 1-4 | 0111 |
| 3A | 12 to 17 mA | and | 3B | 12 to 17 mA | yes | Dual function lever (small "h"-gate) | ILMProp2, byte 8 bits 1-4 | 1000 |
| 4A | diagnose | and | 4B | diagnose | error | error | ILMProp2, byte 8 bits 5-8 | 0000 |
| 4A | diagnose | and | 4B | 5 to 6.9 mA | error | error | ILMProp2, byte 8 bits 5-8 | 0001 |
| 4A | diagnose | and | 4B | 12 to 17 mA | error | error | ILMProp2, byte 8 bits 5-8 | 0010 |
| 4A | 5 to 6.9 mA | and | 4B | diagnose | error | error | ILMProp2, byte 8 bits 5-8 | 0011 |
| 4A | 12 to 17 mA | and | 4B | diagnose | error | error | ILMProp2, byte 8 bits 5-8 | 0100 |
| 4A | 5 to 6.9 mA | and | 4B | 5 to 6.9 mA | no | no lever present | ILMProp2, byte 8 bits 5-8 | 0101 |
| 4A | 12 to 17 mA | and | 4B | 5 to 6.9 mA | yes | standard (plain) lever | ILMProp2, byte 8 bits 5-8 | 0110 |
| 4A | 5 to 6.9 mA | and | 4B | 12 to 17 mA | yes | Dual function lever (big "H"-gate) | ILMProp2, byte 8 bits 5-8 | 0111 |
| 4A | 12 to 17 mA | and | 4B | 12 to 17 mA | yes | Dual function lever (small "h"-gate) | ILMProp2, byte 8 bits 5-8 | 1000 |

If no lever assembly is present, the Hall devices 2102 will not react, thereby facilitating detection of lever presence. Error detection may also be accomplished by comparing the output of the Hall devices 2102 with the remaining hall devices. In one embodiment, lever assemblies may differ in their height, color, part number, how the push function is engaged if at all, etc. If, for example, a standard lever assembly is present (including no push function) it is not possible to have a push function actuated. If a push function Hall device is actuated and a standard lever assembly is installed, an error has occurred. An exemplary lever identification data format for use in a vehicle bus, e.g. a CAN bus, consistent with the present disclosure may be as follows:

```
Byte7       Byte8
AAAABBBB    CCCCDDDD
Where   AAAA = id for lever in position 1
        BBBB = id for lever in position 2
        CCCC = id for lever in position 3
        DDDD = id for lever in position 4
```

FIG. 26 includes plots 2600 of sensed position error for the magnet 310 for a plurality of locations of the Hall devices 600 illustrating stability of the sensing capability of the magnets 310. FIG. 27 includes a plot 2700 of the Gauss at a Hall device 2100 associated with a push feature magnet 702 vs. push feature position illustrating reliable performance of a push circuit consistent with the present disclosure relative to the switching zone of the Hall device. As shown, on/off of the push feature may be safely determined outside of the switching zone 2702 associated with the push feature Hall device 2100. FIG. 27 includes plots 2800 of the Gauss at a Hall device 2102 associated with an ID magnet 1224 vs. ID magnet position illustrating reliable performance of an identification circuit consistent with the present disclosure.

According to one aspect of the disclosure, therefore, there is provided a lever assembly including: a lever; a shaft coupled to the lever for supporting pivotal movement of the lever; a magnet coupled to the lever, the magnet being configured to rotate upon pivotal movement of the lever; and a magnetic field sensor positioned adjacent the magnet for providing an output representative to position of the lever.

According to another aspect of the disclosure there is provided a system including: plurality of lever assemblies, each of the lever assemblies including at least one identification magnet coupled thereto; a plurality magnetic field sensors, each of the magnetic field sensors being positioned adjacent an associated on of the identification magnets; the magnetic field sensors providing an output associated with each of the magnets for indicating connection of the lever assemblies in the system.

According to another aspect of the disclosure there is provided A lever assembly including a lever; a shaft coupled to the lever for supporting pivotal movement of the lever; and a face gear coupled to the shaft, and a pinion gear in meshing engagement with the face gear, whereby pivotal movement of the lever causes rotational movement of the pinion gear.

According to yet another aspect of the disclosure there is provided a lever assembly including: at least one identification magnet coupled to the assembly for positioning adjacent an associated identification magnet in a PCB assembly; and at least one mating peg configured to be received in an associated receptacle in a mating portion of an associated assembly.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

What is claimed is:

1. A lever assembly comprising:
   a lever;
   a shaft coupled to said lever for supporting pivotal movement of said lever;
   a magnet coupled to said lever, said magnet being configured to rotate about an axis that is substantially perpendicular to an axis of rotation of said shaft upon pivotal movement of said lever about said axis of rotation; and
   a magnetic field sensor positioned adjacent said magnet for providing an output representative of a position of said lever.

2. A lever assembly according to claim 1, said assembly further comprising a face gear coupled to said shaft, and a pinion gear in meshing engagement with said face gear, whereby pivotal movement of said lever causes rotational movement of said pinion gear.

3. A lever assembly according to claim 2, wherein said pinion gear includes a mating feature for mating with a corresponding feature of a magnet carrier to cause rotation of said magnet carrier upon rotation of said lever.

4. A lever assembly according to claim 3, wherein said mating feature comprises a slot and said corresponding feature comprises a tab.

5. A lever assembly according to claim 1, said assembly further comprising a magnetic shield encompassing said magnetic field sensor.

6. A lever assembly according to claim 1, wherein said assembly further comprises a pivot arm coupled to said shaft for pivotal movement therewith, and a magnet carrier including a channel for receiving said pivot arm, whereby pivotal movement of said lever causes rotational movement of said magnet carrier.

7. A system comprising:
   a plurality of lever assemblies, each of said lever assemblies having different associated functions, each of said lever assemblies comprising at least one identification magnet coupled thereto;
   a plurality magnetic field sensors, each of said magnetic field sensors being positioned adjacent an associated one of said identification magnets; and
   said magnetic field sensors providing an output associated with each of said magnets for indicating connection of said lever assemblies in said system, and for indicating which of said different associated functions is associated with each of said lever assemblies.

8. A lever assembly comprising:
   a lever;
   a shaft coupled to said lever for supporting pivotal movement of said lever; and
   a face gear coupled to said shaft, and a pinion gear in meshing engagement with said face gear, whereby pivotal movement of said lever causes rotational movement of said pinion gear about an axis that is substantially perpendicular to an axis of rotation of said shaft.

9. A system comprising:
   a plurality of lever assemblies, each of said lever assemblies having different associated functions and each of said lever assemblies comprising at least one associated identification magnet coupled thereto
   and comprising at least one mating peg configuration corresponding to said associated function, each of said associated functions having a different associated mounting peg configuration;
   a plurality of receptacles, each of said receptacles being configured to receive a plurality of different ones of said mating peg configurations, and each of said plurality of receptacles having one of said plurality of lever assemblies positioned therein; and
   a plurality magnetic field sensors, each of said magnetic field sensors being positioned adjacent an associated one of said identification magnets; said magnetic field sensors providing an output associated with each of said magnets for indicating which of said different associated functions is associated with one of said lever assemblies positioned in each of said plurality of receptacles.

10. A lever assembly according to claim 9, said assembly further comprising
    a lever; and
    a shaft coupled to said lever for supporting pivotal movement of said lever.

11. A lever assembly according to claim 10, said assembly further comprising a face gear coupled to said shaft, and a pinion gear in meshing engagement with said face gear, whereby pivotal movement of said lever causes rotational movement of said pinion gear.

12. A lever assembly according to claim 11, wherein said pinion gear is configured to rotate about an axis substantially perpendicular to an axis of rotation of said shaft.

13. A lever assembly according to claim 11, wherein said pinion gear includes a mating feature for mating with a corresponding feature of a magnet carrier to cause rotation of said magnet carrier upon rotation of said lever.

14. A lever assembly according to claim 13, wherein said mating feature comprises a slot and said corresponding feature comprises a tab.

15. A lever assembly according to claim 9, wherein said assembly further comprises a pivot arm coupled to said shaft for pivotal movement therewith.

16. A lever assembly comprising:
    a lever;
    a shaft coupled to said lever for supporting pivotal movement of said lever;
    a magnet coupled to said lever, said magnet being configured to rotate about an axis that is substantially perpendicular to an axis of rotation of said shaft upon pivotal movement of said lever about said axis of rotation;
    a first magnetic field sensor positioned adjacent said magnet for providing an output representative of a position of said lever;
    at least one identification magnet; and
    a second magnetic field sensor positioned adjacent said at least one identification magnet,
        said second magnetic field sensor providing an output in response to said identification magnet for indicating which of a plurality of different associated functions is associated with said lever assembly.

17. A lever assembly according to claim 16, said assembly further comprising a face gear coupled to said shaft, and a pinion gear in meshing engagement with said face gear, whereby pivotal movement of said lever causes rotational movement of said pinion gear.

18. A lever assembly according to claim 17, wherein said pinion gear includes a mating feature for mating with a corresponding feature of a magnet carrier to cause rotation of said magnet carrier upon rotation of said lever.

19. A lever assembly according to claim 18, wherein said mating feature comprises a slot and said corresponding feature comprises a tab.

20. A lever assembly according to claim 17, said assembly further comprising a magnetic shield encompassing said first magnetic field sensor.

21. A lever assembly according to claim 17, wherein said assembly further comprises a pivot arm coupled to said shaft for pivotal movement therewith, and a magnet carrier including a channel for receiving said pivot arm, whereby pivotal movement of said lever causes rotational movement of said magnet carrier.

* * * * *